United States Patent
Marian, Jr. et al.

[11] Patent Number: 5,865,650
[45] Date of Patent: Feb. 2, 1999

[54] ULTRASOUND ADAPTER

[75] Inventors: Vaughn R. Marian, Jr., Saratoga; Donald R. Mullen, Fremont, both of Calif.

[73] Assignee: Acuson Corporation, Mountain View, Calif.

[21] Appl. No.: 734,771

[22] Filed: Oct. 22, 1996

[51] Int. Cl.$^6$ .................................................. H01R 9/05
[52] U.S. Cl. ........................................ 439/638; 439/76.1
[58] Field of Search ................................. 439/638, 76.1, 439/289, 364, 267, 268, 66, 65, 67, 77, 493, 497, 581

[56] References Cited

U.S. PATENT DOCUMENTS

| | | | |
|---|---|---|---|
| 3,221,286 | 11/1965 | Fedde | 439/65 |
| 4,082,394 | 4/1978 | Gedney et al. | 439/65 |
| 4,540,229 | 9/1985 | Madden | 439/261 |
| 4,550,607 | 11/1985 | Maslak et al. | 73/626 |
| 4,600,256 | 7/1986 | Anttila | 439/65 |
| 4,699,009 | 10/1987 | Maslak et al. | 73/626 |
| 4,889,499 | 12/1989 | Sochor | 439/268 |
| 4,904,197 | 2/1990 | Cabourne | 439/267 |
| 5,116,237 | 5/1992 | Loewen | 439/326 |
| 5,190,473 | 3/1993 | Mroczkowski et al. | 439/580 |
| 5,274,917 | 1/1994 | Corbett, III et al. | 29/860 |
| 5,308,252 | 5/1994 | Mrcozkowski et al. | 439/66 |
| 5,310,352 | 5/1994 | Mroczkowski et al. | 439/76 |
| 5,358,411 | 10/1994 | Mroczkowski et al. | 439/66 |
| 5,385,490 | 1/1995 | Demeter et al. | 439/579 |
| 5,402,791 | 4/1995 | Saitoh et al. | 128/662.03 |
| 5,417,578 | 5/1995 | Mroczkowski et al. | 439/101 |

OTHER PUBLICATIONS

R. Rothenberger and R.S. Mroczkowski, *High–Density Zero Insertion Force Microcoaxial Cable Interconnection Technology*, AMP Inc., pp. 1–5.
Material Safety Data Sheet for CIDEX™, 3 pages.
Material Safety Data Sheet for STERIS 20™, 3 pages.
Product Description "DL Zero Insertion Force Connectors", ITT Cannon, 5 pages.
SPIE (International Society for Optical Engineering) Proceedings Reprint, vol. 1373, 21–22 Jul. 1992, pp. 249–259.

*Primary Examiner*—Paula Bradley
*Assistant Examiner*—Tho Dac Ta
*Attorney, Agent, or Firm*—Ladas & Parry

[57] ABSTRACT

An ultrasound adapter assembly includes a rectangular zero-insertion-force receptacle, such as the ITT Cannon® DL-series Zero Insertion Force ("DL-ZIF") receptacle, and a high-density micro-coaxial ("HDMC") connector plug interconnected by micro-coaxial conductors. The adapter assembly includes a frame for supporting the two connectors and a locking mechanism for use in semi-permanently attaching the adapter assembly to an ultrasound imaging system receptacle. The adapter assembly permits old-style ultrasound transducer assemblies having the rectangular zero-insertion-force plug to be used with newer ultrasound imaging systems using the newer HDMC interfacing system. In an alternative embodiment, the two connectors are electrically interconnected using flex-circuit. The HDMC connector plug is formed using a multi-layer printed wiring board having a high density array of electrical contact pads on one surface arranged for compatible mating with the newer system HDMC interfacing receptacle. Solder pads are placed on the opposed surface for solder attachment of the micro-coaxial cables and the alternative flex-circuit. A second multi-layer printed wiring board includes pre-tinned feedthroughs for solder connection to the Cannon DL-ZIF connector. An opposed surface of the second printed wiring board includes solder pads for attachment of the micro-coaxial cables and the alternative flex-circuit. In another alternative embodiment, the flex-circuit is attached at both ends to separate connectors forming an interconnection assembly, and both the second printed wiring board and the HDMC plug printed wiring board include mating connectors for attachment of the interconnecting flex-circuit assembly.

26 Claims, 10 Drawing Sheets

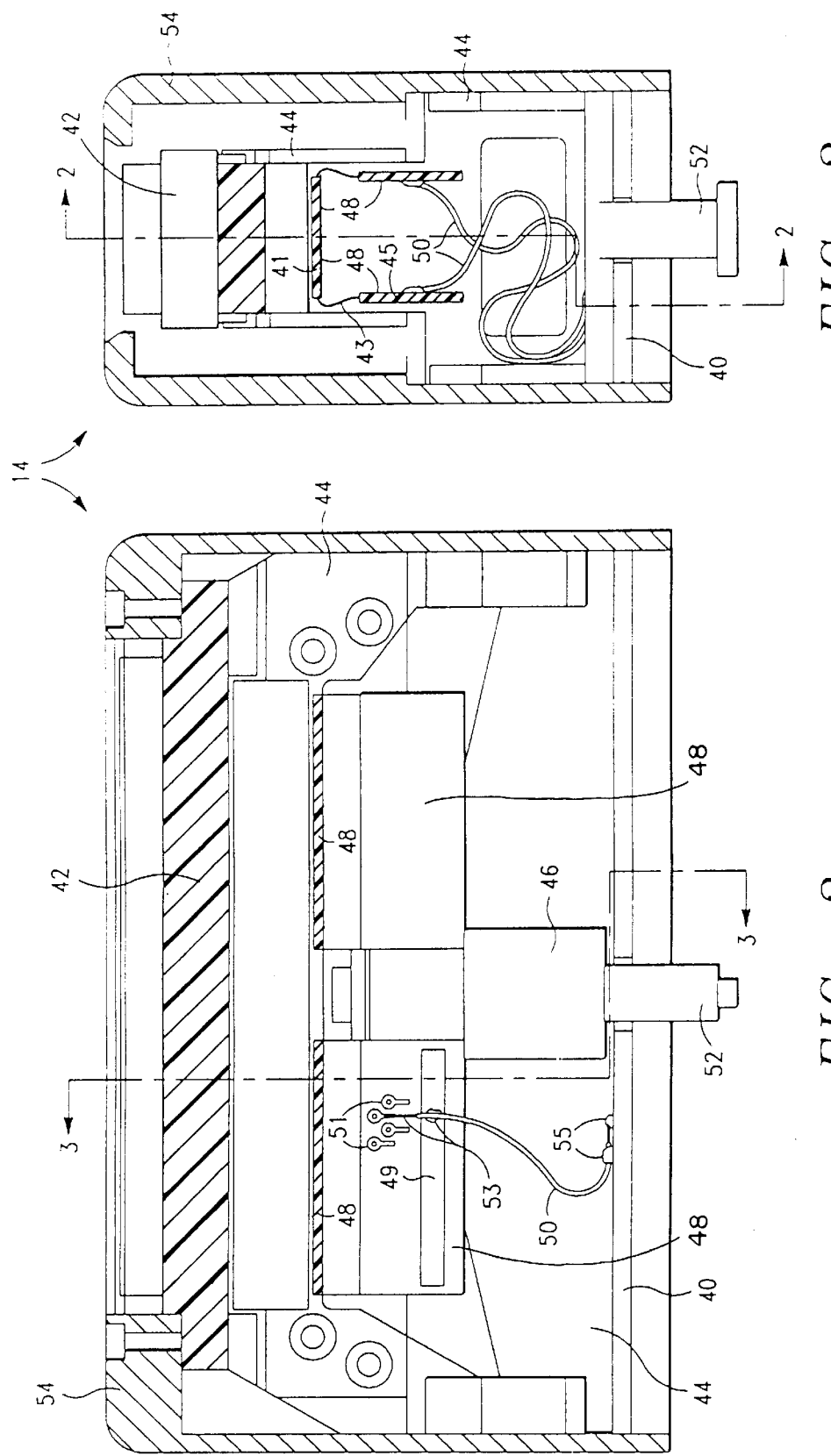

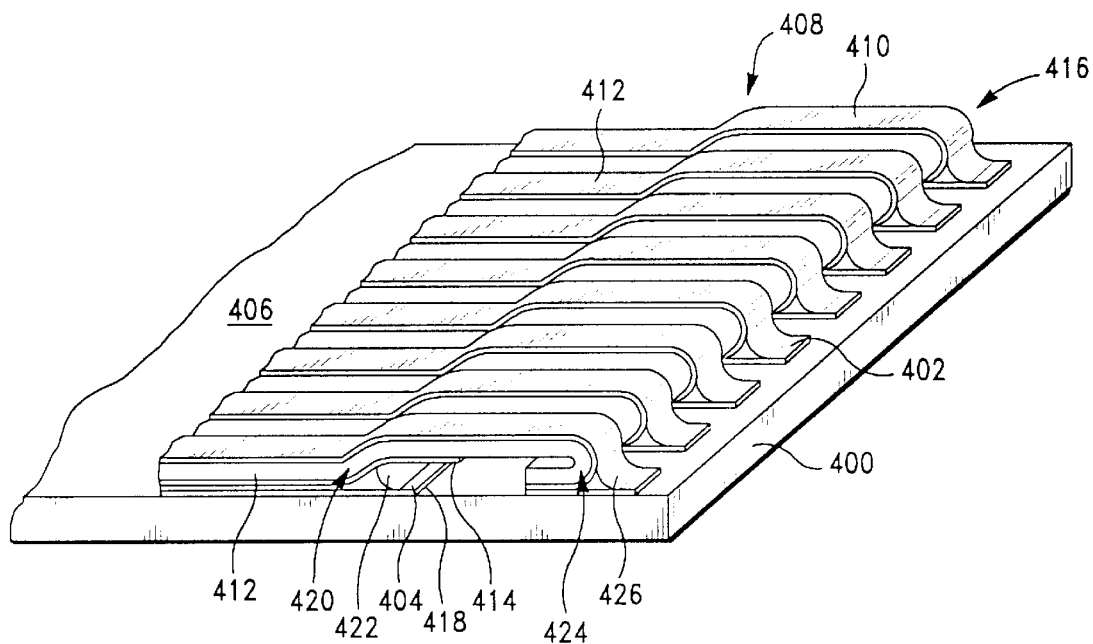
FIG.—17
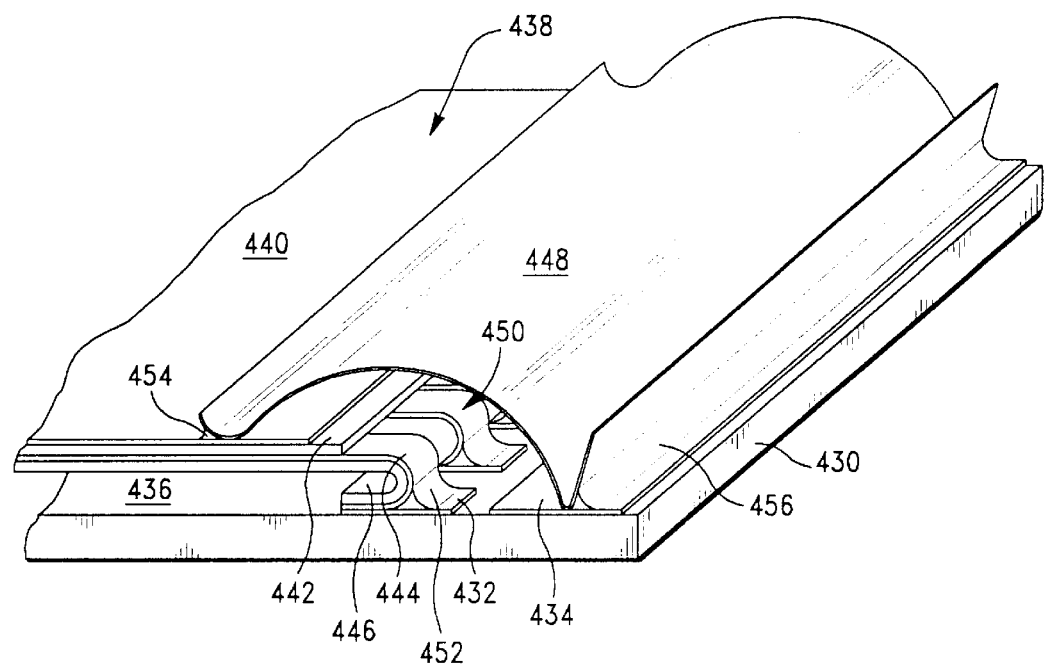
FIG.—18

5,865,650

ULTRASOUND ADAPTER

RELATED APPLICATION

This Patent Application is related to U.S. Pat. No. 5,310, 352, issued May 10, 1994, entitled "Substrate Interfacing Electrical Connector System", and assigned to Whitaker Corp. and to the assignee of the present invention; and is also related to co-pending U.S. patent applications, (1) Ser. No. 08/538,870, filed Oct. 4, 1995, entitled "Submersible Connector System", and (2) Ser. No. 08/584,332, filed Jan. 5, 1996, entitled "Modular Transducer System", both assigned to the assignee of the present invention. The disclosures of these related documents, including the Appendix of U.S. patent application Ser. No. 08/538,870, are incorporated herein by reference.

BACKGROUND OF THE INVENTION

FIELD OF THE INVENTION

The present invention relates to an adapter assembly for attaching an electrical plug of one type to electrical equipment having a receptacle of a different type, such as, for example, adapting a member of the ITT Cannon® DL-series Zero Insertion Force plug/receptacle family or its equivalent (e.g., the AMP® model M-ZIF-series plug/receptacle family), to a high-density micro-coaxial receptacle/plug for use in connecting peripheral devices to ultrasound imaging systems, or otherwise making connections within peripheral devices or imaging systems in medical ultrasound applications.

BACKGROUND OF THE INVENTION

An ultrasound imaging system generally includes an ultrasound transducer assembly and a system console. A typical ultrasound imaging system is shown in FIG. 1 and includes electrical connectors for attaching the transducer assembly to the system console.

Known ultrasound imaging systems of the type illustrated in FIG. 1 are disclosed in U.S. Pat. No. 4,550,607 and U.S. Pat. No. 4,669,009, both to Maslak et al and assigned to the assignee of the present invention.

In the electrical connector field in which mating connectors are used to connect cables to cables or cables to panels, one connector is typically designated as the "plug" while the corresponding mating connector is referred to as the "receptacle."

In the ultrasound imaging field, the transducer assembly typically includes a cable which terminates at one end with a connector. This connector is generally designated as the plug. The system console typically has a panel upon which is mounted a system receptacle which is compatible with the transducer assembly plug for connection of the transducer assembly to the ultrasound system console.

The ultrasound transducer assembly generally includes a scan head in addition to the cable and the connector. The system console includes a display monitor for displaying system generated images.

When properly controlled by the system console, the scan head radiates ultrasound acoustic waves into the body of a patient. The same scan head receives acoustic echoes from internal body organs and converts these echoes into electrical signals which are then conveyed to the system console through the interfacing cable and the connectors. The electrical signals are then interpreted by the system console and an image of the internal body organ is created and displayed on the monitor.

In an imaging system employing phased array ultrasound, the scan head consists of a multitude of independent piezoelectric elements arranged in a linear array. Typically each element of the linear array is independently controlled by a separate coaxial signal line within the transducer assembly interfacing cable. Since many coaxial conductors are typically involved, the connector interface between the ultrasound transducer assembly and the system console can become quite complex.

One important requirement of this interface is its electrical integrity. The quality of the images generated on the display monitor of the system console are very dependent upon the electrical characteristics of the connector interface. Cross talk between the multitude of channels and electrical interference to and from external electrical equipment must be minimized. The frequency of the analog signals passed to and from the transducer assembly can range between 1 MHz and 50 MHz. The signal voltage levels can range from nano-volts to hundreds of volts. Therefore it is desirable that the connector interface be electrically compatible with signals having a broad dynamic range.

Many existing and older style ultrasound imaging systems use the ITT Cannon® DL-series Zero Insertion Force (hereafter "DL-ZIF") system receptacle, or its equivalent, which has met the needs of existing ultrasound transducer assemblies. These rectangular connectors have been used for many years with the result that many existing ultrasound transducer assemblies would become obsolete if a newer system receptacle came into common practice because the rectangular DL-ZIF plug, or its equivalent, would be incompatible with the newer-type system receptacle. When the phrase "rectangular zero-insertion-force . . ." is used herein, the phrase includes rectangular members of the ITT Cannon® DL-ZIF series of connectors, and their equivalents, as for example the AMP® M-ZIF series of connectors.

Newer ultrasound imaging systems use, or could use, a high performance, high-density micro-coaxial (hereafter "HDMC") interfacing connector as the system receptacle. This new connector system is compatible with a newer generation of ultrasound transducers and has frequency capabilities up to 20 MHz, channel counts up to 256 channels, and vastly improved cross talk and signal integrity performance. The HDMC connector system is described and claimed in the related U.S. Pat. No. 5,310,352, which also discloses other uses for the connector system. The HDMC connector system is also described in the related, co-pending U.S. patent applications, Ser. No. 08/538,870 and Ser. No. 08/584,332.

Without some kind of adapter, the older transducers using the ITT Cannon® DL-ZIF rectangular connector system, or its equivalent, are not compatible with the interfacing connectors of the new imaging systems having the new HDMC receptacles. Without the adapter, the customer's inventory of existing transducer assemblies is made obsolete by the introduction of the new imaging systems. This adapter enables the owner of the newer imaging system to use older transducers which have the ITT Cannon® DL-ZIF system rectangular connectors, or their equivalent. This approach provides a marketing advantage where a particular transducer is not yet available with the new HDMC connector.

Unless there is some convenient and easy to use apparatus for converting the "old" transducers to the new system, some users may have to revert to use of the older imaging systems for certain diagnostic procedures when existing transducer assemblies are not compatible with new ultrasound imaging systems. This possibility is especially true during the critical period just after product introduction. Also, many low volume transducers may make no economic sense to convert for use with the newer imaging systems.

What is needed is a mechanically simple adapter which permits a transducer assembly having an ITT Cannon® DL-ZIF plug, or its equivalent, to be mechanically and electrically connected to an ultrasound imaging system equipped with an HDMC receptacle.

SUMMARY OF THE INVENTION

The above stated need is met by the present invention which is an ultrasound adapter assembly which includes an ITT Cannon® DL-ZIF rectangular receptacle electrically interconnected with a multi-layer printed wiring board defining an HDMC plug. The receptacle and plug are supported by a frame and are enclosed in a convenient protective housing.

The adapter allows a transducer with an ITT Cannon® DL-ZIF rectangular connector to be plugged into an ultrasound imaging system which has only HDMC receptacles. The adapter is a self contained unit which is installed on, and becomes part of the system. The rectangular DL connector for the transducer assembly is then plugged into the adapter receptacle in the normal manner.

Conveyance of bidirectional signals between the system and the transducer assembly are accomplished through the use of micro-coaxial conductors within the assembly. The identification code of the transducer is read by the system during the initialization sequence in the normal manner.

In one embodiment, a second printed wiring board is attached to the "wiring side" of the DL-ZIF rectangular receptacle and provides printed wiring pads for solder attachment of the micro-coaxial conductors.

One alternative embodiment uses industry standard flex-circuit to convey electrical signals between the HDMC plug printed wiring board and the DL-ZIF rectangular receptacle printed wiring board.

Another alternative embodiment uses mating electrical plugs and receptacles to convey electrical signals between the HDMC plug printed wiring board and the DL-ZIF rectangular receptacle printed wiring board.

Yet another alternative embodiment includes a remote version of the adapter. In this case, a DL-ZIF receptacle is connected electrically to the HDMC plug by use of a cable containing a multitude of micro-coaxial conductors. In this case, the adapter allows the transducer to be interfaced to the ultrasound imaging system at locations remote from the console system receptacles.

DESCRIPTION OF THE DRAWINGS

For a further understanding of the objects, features and advantages of the present invention, reference should be had to the following description of the preferred embodiment, taken in conjunction with the accompanying drawing, in which like parts are given like reference numerals and wherein:

FIG. 2 is a cross-sectional side view of an ultrasound adapter assembly such as shown in FIG. 1.

FIG. 3 is a cross-sectional end view of the adapter assembly of FIG. 2 looking in the direction of the arrows along line 3—3.

FIG. 17 is a partial perspective view illustrating one method for directly attaching flex-circuit to a printed wiring board.

FIG. 18 is a partial perspective view illustrating another method for directly attaching flex-circuit to a printed wiring board.

DESCRIPTION OF THE PREFERRED EMBODIMENT

Figure 1:
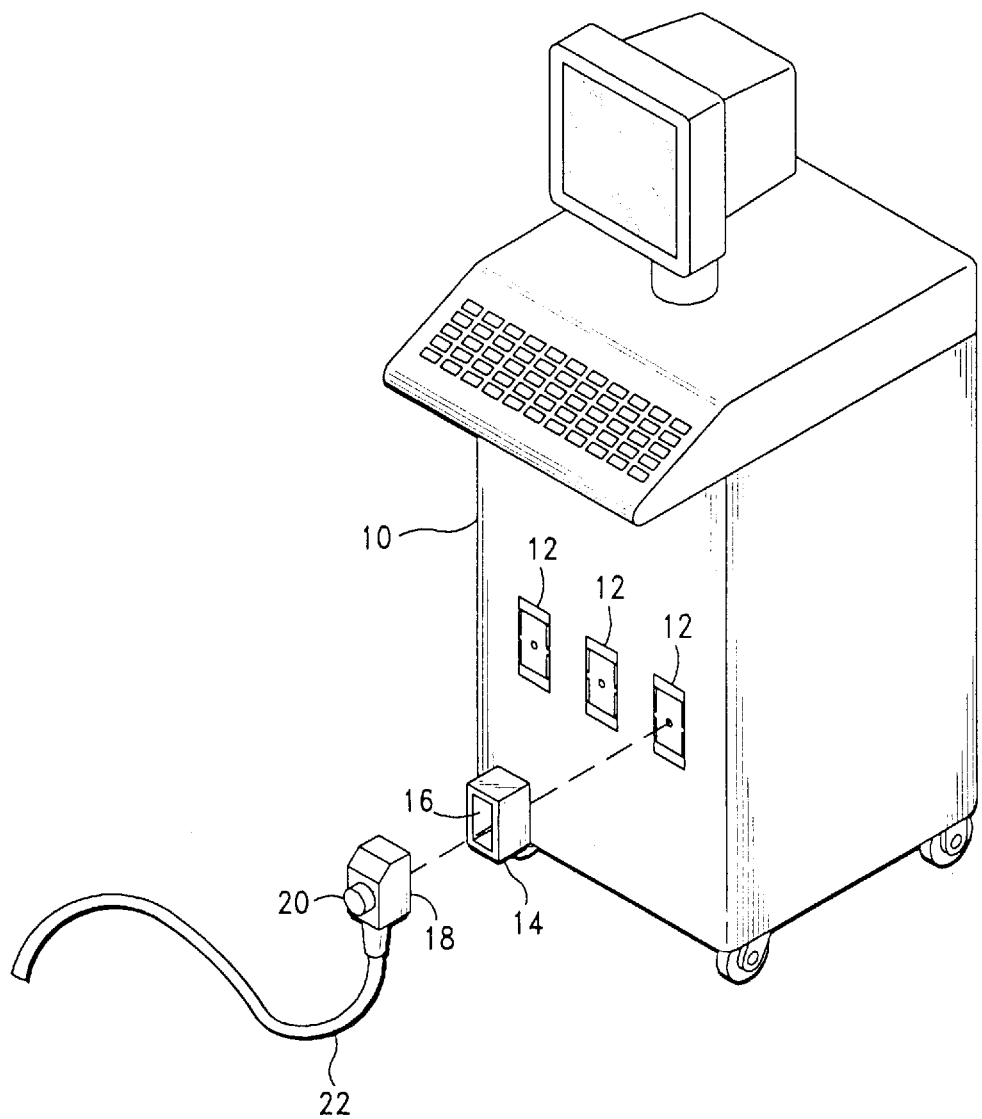
FIG. 1 is a pictorial diagram illustrating an ultrasound system including an ultrasound adapter assembly in accordance with the present invention.

The invention will now be described with respect to FIG. 1, a pictorial diagram illustrating an ultrasound imaging system.

The ultrasound imaging system is designated generally by the numeral 10 and includes one or more of the new HDMC system receptacles 12, an adapter assembly 14 having an older-style rectangular zero-insertion-force receptacle 16, and an older ultrasound transducer assembly equipped with a rectangular zero-insertion-force plug 18, a locking knob 20 and a cable 22. Each system receptacle 12 is an HDMC interfacing receptacle, such as the contact nest (108) which is disclosed in the previously incorporated, co-pending U.S. patent application, Ser. No. 08/538,870, and in U.S. Pat. Nos. 5,308,252 and 5,358,411, the teachings of which are incorporated herein by reference.

The adapter assembly 14 includes an HDMC plug (not shown) for mating compatibly with the system receptacle 12. The adapter 14 also includes a locking mechanism (not shown) for semi-permanently attaching the adapter to the system console. In use, the adapter assembly 14 is attached to a system receptacle 12 and the locking mechanism is operated to form a secure mechanical coupling between the adapter 14 and the imaging system console.

With respect to FIG. 2 there is shown a cross-sectional side view of an ultrasound adapter assembly according to one aspect of the present invention and depicted generally by the numeral 14. The view is taken along the line 2—2 of FIG. 3, looking in the direction of the arrows.

A preferred embodiment of the adapter assembly 14 includes a printed wiring board 40, an ITT Cannon® DL-ZIF rectangular receptacle 42, a supporting frame 44, a locking mechanism 46, industry standard rigid-flex interconnection members 48, a representative micro-coaxial conductor 50, an engagement portion 52 of the locking mechanism, and a protective housing 54.

FIG. 3 is a cross-sectional end view of the adapter assembly 14 taken along the line 3—3 of FIG. 2, looking in the direction of the arrows. FIG. 3 illustrates the printed wiring board 40, the Cannon rectangular receptacle 42, portions of the supporting frame 44, the engagement portion 52 of the locking mechanism 46, the rigid-flex interconnection members 48, representative micro-coaxial conductors 50, and the protective housing 54.

In a preferred embodiment of the adapter assembly 14, the printed wiring board 40 is a multi-layer element having electrical contact pads (not shown) on one surface and solder pads (not shown) for connecting the micro-coaxial conductors 50 on an opposed surface. The electrical contacts pads are arranged to conform with electrical contacts of the system receptacle 12, and the printed wiring board 40 defines an HDMC plug. The printed wiring board 40 has a preferred thickness of 0.125" and is made of FR4, an epoxy-glass laminate (available from Metro Circuits, Rochester, N.Y., among others). The printed wiring board 40 is supported along its edges by portions of the supporting frame 44 and is sufficiently stiff so that good contact with the mating electrical contacts of the system receptacle 12 is assured.

The frame 44 provides support for the ITT Cannon® DL-ZIF rectangular receptacle in relation to the printed wiring board 40, as illustrated in FIGS 2, 3. The frame 44, the receptacle 42 and the plug 40 are all enclosed within the protective housing 54, which protects the entire assembly 14 and provides an element of safety.

The rigid-flex 48 includes a first rigid portion 41 (FIG. 3), a flex-circuit portion 43, and a second rigid portion 45. The two rigid portions 41, 45 are printed wiring boards and are electrically connected via the flex-circuit portion 43 to form an interconnection assembly. The rigid portion 41 includes plated-through feedthroughs spaced to fit compatibly over a wiring end of electrical contacts (not shown) which extend from a wiring side of the DL-ZIF rectangular receptacle 42. The second rigid portion 45 includes a solder strip 49 (FIG. 2) and solder pads 51 for solder connection of one end of the micro-coaxial conductors 50.

A rigid-flex assembly 48 of the type illustrated is available from any of the following sources: Silicon Valley Printed Circuits, Inc. of Santa Clara, Calif.; Tech Etch, Inc. of Plymouth, Mass.; and Parlex Corp. of Salem, N.H.

An electrical connection is completed between a pair of DL-ZIF receptacle 42 contacts and a corresponding pair of HDMC plug (printed wiring board) 40 contact pads via the rigid-flex interconnection assembly 48 and the micro-coaxial conductor 50. Solder connections between one end of the micro-coaxial conductor 50 and the rigid-flex solder strip and solder pads are shown at 53 of FIG. 2, and between the printed wiring board 40 and the other end of the micro-coaxial conductor 50 at 55 of FIG. 2.

Figure 4:
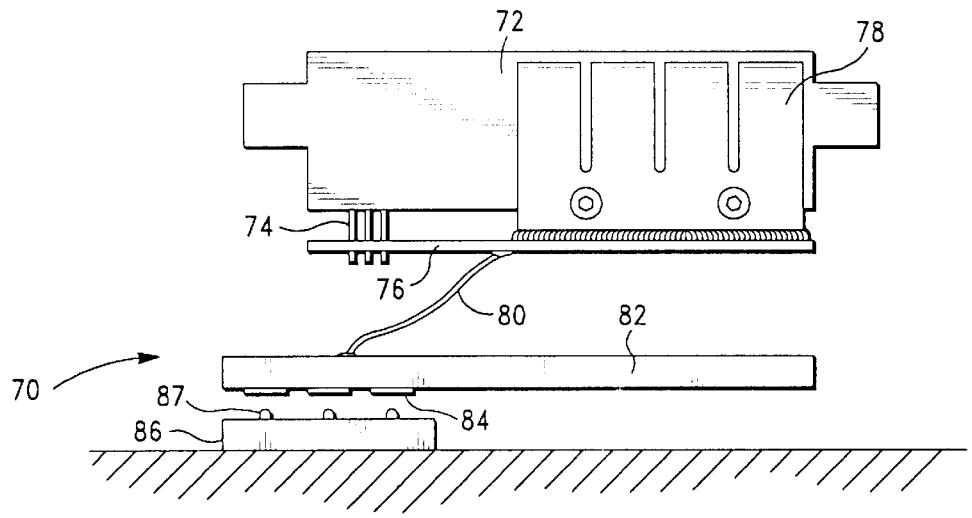
FIG. 4 is a pictorial side view of an adapter assembly illustrating a micro-coaxial conductor electrical connection between a DL-ZIF rectangular receptacle and an HDMC plug.

An understanding of another preferred electrical connection between the DL-ZIF receptacle 42 and the HDMC plug 40 of FIGS 2, 3 will be gained from an examination of FIG. 4 which provides a pictorial side view of an adapter assembly, designated generally by the numeral 70. The adapter assembly 70 illustrates a rectangular zero-insertion-force receptacle 72 including a wiring end of representative electrical contacts 74, a printed wiring board 76, grounding fingers 78, a micro-coaxial conductor 80, and a multi-layer printed wiring board 82 having system contact pads 84. FIG. 4 also illustrates an HDMC contact module 86 including electrical contact springs 87 (see the previously incorporated, co-pending U.S. patent application, Ser. No. 08/538,870, and U.S. Pat. Nos. 5,308,252 and 5,358,411).

The embodiment illustrated in FIG. 4 does not use the rigid-flex assembly as shown in FIGS 2, 3, but instead uses a printed wiring board 76 attached to the electrical contacts 74 for attachment of one end of the micro-coaxial conductor 80.

The printed wiring board 76 includes a series of plated-through feedthroughs (not shown) which are located to fit compatibly over the electrical contacts 74. The printed wiring board 76 is then attached to the DL-ZIF receptacle 72 by soldering the feedthroughs to the electrical contacts 74. The printed wiring board 76 includes a series of solder pads (not shown) for the solder connection of one end of the micro-coaxial conductor 80, approximately one micro-coaxial conductor 80 for each pair of electrical contacts 74.

Connectors using the HDMC contact module 86 (spring contact assembly) are well known and will not be further described. For additional details, see the previously incorporated, co-pending U.S. patent application, Ser. No. 08/538,870, and U.S. Pat. Nos. 5,308,252, 5,358,411 and 5,310,352, the disclosures of which are incorporated by reference.

When the adapter assembly 14 (FIG. 1) is attached to the HDMC system receptacle 12, the electrical contact pads 84 of the multi-layer printed wiring board 82 deform the electrical spring contacts 87 of the HDMC contact module 86 resulting in a wiping action of the metal spring contacts 87 across the corresponding printed wiring contact pads 84. This wiping action of metal against metal produces a superior electrical connection. The electrical contact pads 84 are typically plated on the surface with a hard gold covering as described in U.S. Pat. No. 5,310,352.

Figure 5:
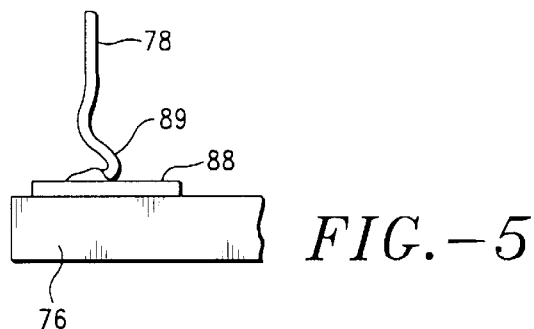
FIG. 5 is a partial detail view illustrating the solder attachment of grounding fingers to a printed wiring board.

FIG. 5 is a pictorial end view of a portion of the printed wiring board 76 and the grounding fingers 78. One side of the printed wiring board 76 includes a solder strip 88 along which one folded end 89 of the grounding finger assembly 78 is soldered. The solder strip 88 is electrically connected to a system ground potential, effectively grounding the grounding finger assembly 78. The grounding finger assembly 78 forms an electrostatic cage surrounding the DL-ZIF rectangular receptacle and cooperates with the printed wiring board 76 to shield the connector from stray electric fields. The mating DL-ZIF rectangular connector 18 (FIG. 1) includes grounding fingers which mate compatibly with the grounding fingers 78 to complete the protective electrostatic shield and to increase the total cross-sectional area of copper available for grounding the attachable ultrasound imaging transducer assembly.

Figure 6:
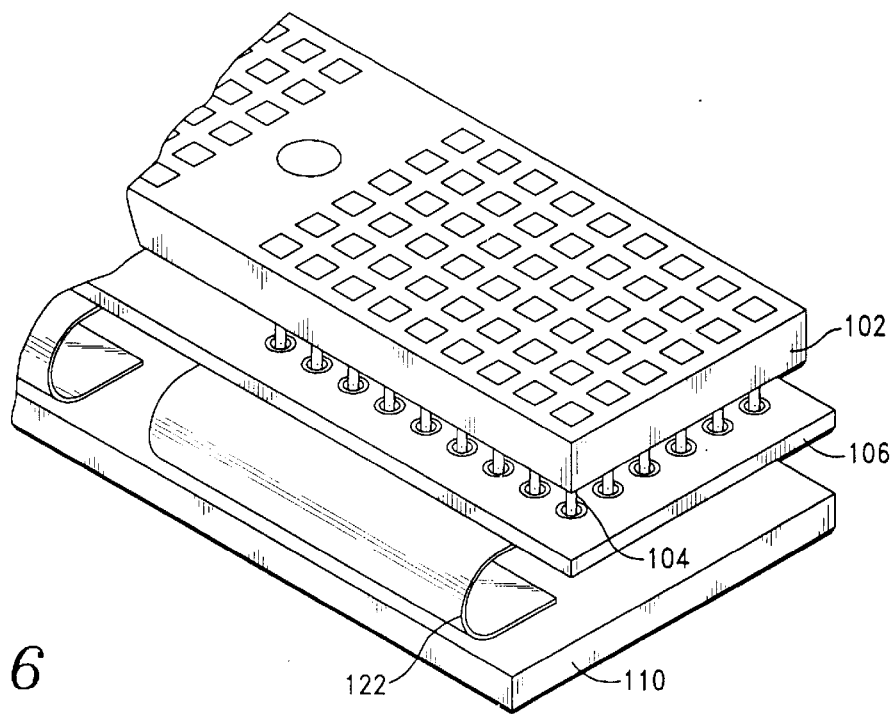
FIG. 6 is a pictorial side view of an adapter assembly illustrating an alternative flex-circuit electrical connection between printed wiring boards.

Another alternative embodiment of the electrical interconnection between the DL-ZIF rectangular receptacle and the HDMC plug is illustrated in FIG. 6, another pictorial partial side view of an adapter assembly. The embodiment includes a DL-ZIF rectangular receptacle 102 having electrical contacts 104, a printed wiring board 106, a multi-layer printed wiring board 110, and a flex-circuit 122.

In a preferred embodiment, the printed wiring board 106 includes plated-through feedthroughs for attaching the board 106 directly to the electrical contacts 104 by soldering. The flex-circuit 122 is soldered to other plated-through feedthroughs on the printed wiring board 106 and the electrical connection between the flex-circuit 122 and the electrical contacts 104 is completed via printed wiring within the printed wiring board 106.

The multi-layer printed wiring board 110 defines an HDMC plug and is attached to a second end of the flex-circuit 122 by soldering, and an electrical circuit is completed between the second end of the flex-circuit 122 and electrical contact pads (not shown) via printed wiring within the multi-layer printed wiring board 110.

Electrical continuity is thereby established from the electrical contacts 104 of the DL-ZIF rectangular receptacle 102 to the electrical contact pads of the HDMC plug defined by the printed wiring board 110.

Figure 7:
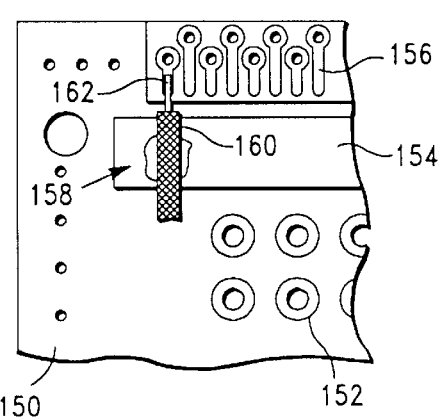
FIG. 7 is a partial pictorial view of a DL-ZIF rectangular connector printed wiring board illustrating a soldered connection of a micro-coaxial conductor.

FIG. 7 is a partial pictorial view of a DL-ZIF connector printed wiring board illustrating the manner in which the micro-coaxial conductor 80 is attached to the printed wiring board 76 in FIG. 4. The illustrated portion of the printed wiring board is designated by the numeral 150 and includes plated-through feedthroughs 152, a solder strip 154, solder pads 156, and one end of a micro-coaxial conductor 158 including an outer braided shield 160 and a center conductor 162.

During manufacturing of the adapter assembly 14, the printed wiring board 150 is attached to the DL-ZIF rectangular receptacle 42 (FIG. 2) by fitting the plated-through feedthroughs 152 over the DL-ZIF receptacle electrical contacts 74 (FIG. 4) and soldering each feedthrough to the inserted electrical contact. In a preferred embodiment, this manufacturing step is accomplished by flow-soldering the board 150 once the electrical contacts 74 (FIG. 4) have been inserted through the feedthroughs 152.

In a next manufacturing step, one end of short lengths of micro-coaxial conductors 158 are attached between the solder strip 154 and the individual solder pads 156. During this manufacturing step, the outer braided shield 160 is soldered to the solder strip 154 and the center conductor 162 is soldered to the individual solder pads 156.

Because the individual solder pads 156 are so small, and because the micro-coaxial conductors 158 are very small (ranging in size from no. 38 AWG to no. 46 AWG), the technique of attaching the conductors 158 requires a great deal of care and skill to avoid damage to the individual conductors and to avoid the creation of electrical short circuits between adjacent solder pads 156. Four companies known to provide reliable soldering of micro-coaxial conductors to very small, densely laid out solder pads are W. L. Gore & Assoc. of Phoenix, Ariz.; Precision Interconnect, Inc. of Portland, Oreg.; Vemco, Inc. of Burlington, Vt.; and Axion Cable S.A. of Montmiral, France.

Figure 8:
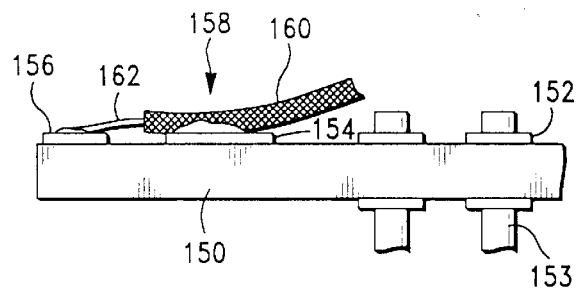
FIG. 8 is a partial end view of the printed circuit board of FIG. 7 showing the soldered connection of the micro-coaxial conductor.

FIG. 8 is a partial pictorial end-view of the circuit board and the micro-coaxial conductor illustrated in FIG. 7. The figure includes the printed wiring board 150, the plated-through feedthroughs 152, DL-ZIF rectangular receptacle electrical contacts 153, the solder strip 154, the solder pads 156, the micro-coaxial conductor 158 having the braided shield 160 and the center conductor 162. The braided shield 160 is shown soldered to the solder strip 154, and the center conductor 162 is shown soldered to one of the solder pads 156.

Figure 9:
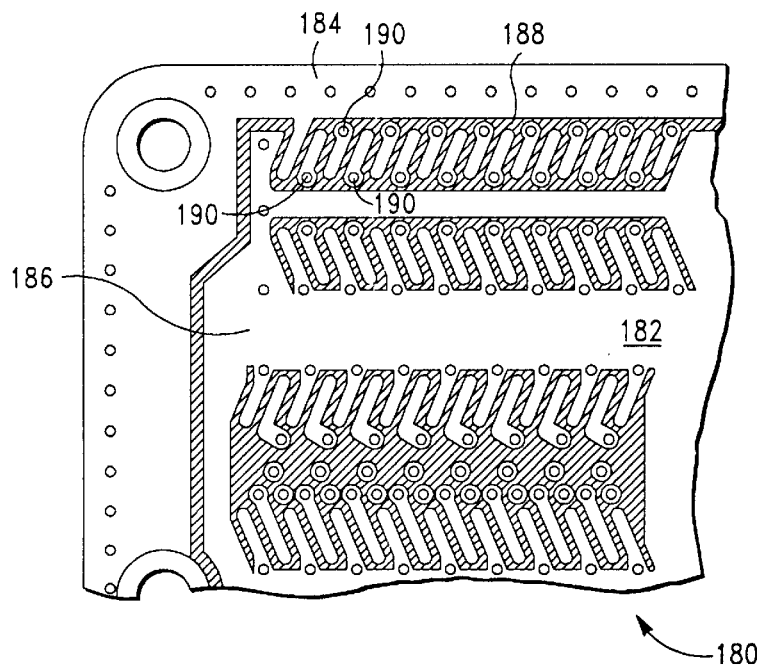
FIG. 9 is a partial bottom view of a multi-layer printed wiring board illustrating electrical contact pads for connection to an ultrasound system HDMC receptacle.

FIG. 9 is a partial pictorial view of a contact pad surface of a multi-layer printed wiring board defining an HDMC plug. The printed wiring board is designated generally by the numeral 180. The printed wiring board 180 includes a contact-pad surface 182 having primarily a printed wiring ground plane partitioned into several portions 184, 186 and creating void areas 188 within the ground plane within which void areas are placed separate electrical contact pads 190. The contact pads 190 are arranged within the void areas 188 to conform with corresponding contact springs 87 (FIG. 4) of the HDMC contact modules 86 illustrated in FIG. 4 and described in greater detail in the U.S. patent application, Ser. No. 08/538,870 and U.S. Pat. Nos. 5,308,252 and 5,358,411.

Figure 10:
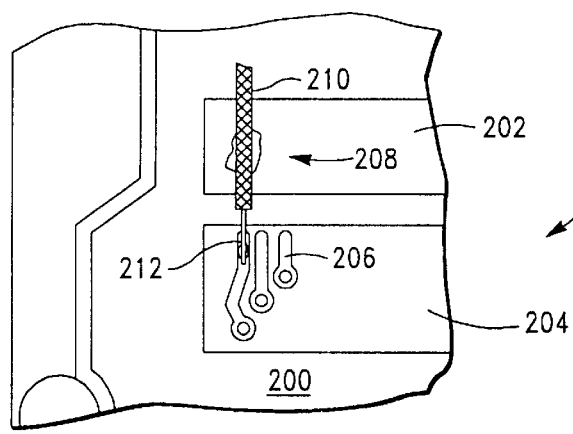
FIG. 10 is a partial top view of the multi-layer printed wiring board of FIG. 9 illustrating a soldered connection of a micro-coaxial conductor.

The attachment of the second end of the short lengths of each micro-coaxial conductor to the multi-layer printed wiring board 180 is illustrated in FIG. 10, a partial pictorial view of the opposed surface of the board 180. The illustrated portion includes a printed wiring ground plane 200 having a solder strip region 202 and a void area 204 within which are located separate solder pads 206, one end of a micro-coaxial conductor 208 having a braided shield 210 and a center conductor 212. The braided shield is soldered to the solder strip region 202 and the center conductor 212 is soldered to one of the separate solder pads 206.

Within the multi-layer printed wiring board 180, printed wiring is used to connect the contact pads 190 of FIG. 9 with predetermined solder pads 206 of FIG. 10.

Figure 11:
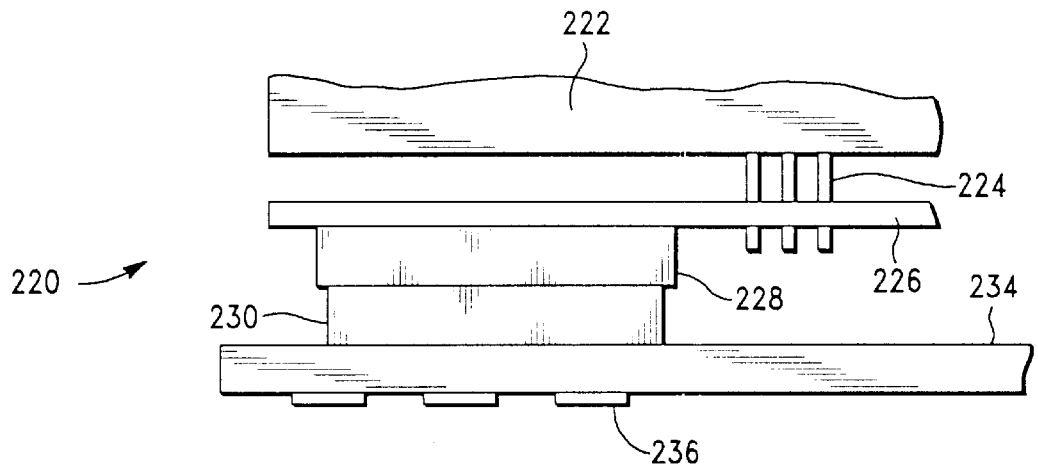
FIG. 11 is a partial pictorial side view of electrical connections completed via a surface pin mount and contact connector system.

FIG. 11 is a partial pictorial side view of adapter assembly electrical connections completed via a surface pin mount and contact connector system, and designated generally by the numeral 220. The adapter assembly 220 includes a rectangular zero-insertion-force receptacle 222, electrical contacts 224, a first printed wiring board 226, mating surface pin mount and contact connectors 228 and 230, a second printed wiring board 234, and electrical contact pads 236.

The electrical contacts 224 are part of the rectangular receptacle 222. The contacts 224 are connected to the first printed wiring board 226 using a solder connection to plated-through feedthroughs (152 of FIG. 7). One mating half 228 of the surface pin mount and contact connector system 228, 230 is electrically and mechanically connected to the first printed wiring board 226 using solder. An electrical connection is thereby established via printed wiring between the electrical contacts 224 and corresponding contacts of the mating connector half 228. The other mating connector half 230 is also attached by solder to the second printed wiring board 234, and contacts of the connector half 230 are electrically connected to corresponding contact pads 236.

The second printed wiring board 234 and contact pads 236 define a high-density micro-coaxial interfacing plug. The electrical connection between the electrical contacts 224 of the rectangular receptacle and the contact pads 236 of the defined HDMC plug is completed via the printed wiring, solder connections, and the pins and contacts of the mating connector system 228, 230. A preferred connector system 228, 230 is the Series DF12, supplied by the SAE Corporation of Irvine, Calif.; also the Series WR, from the Herosi Electric Corporation of Simi Valley, Calif.; and the Metristak Connector System, from AMP Inc. of Kawasaki, Japan.

Figure 12:
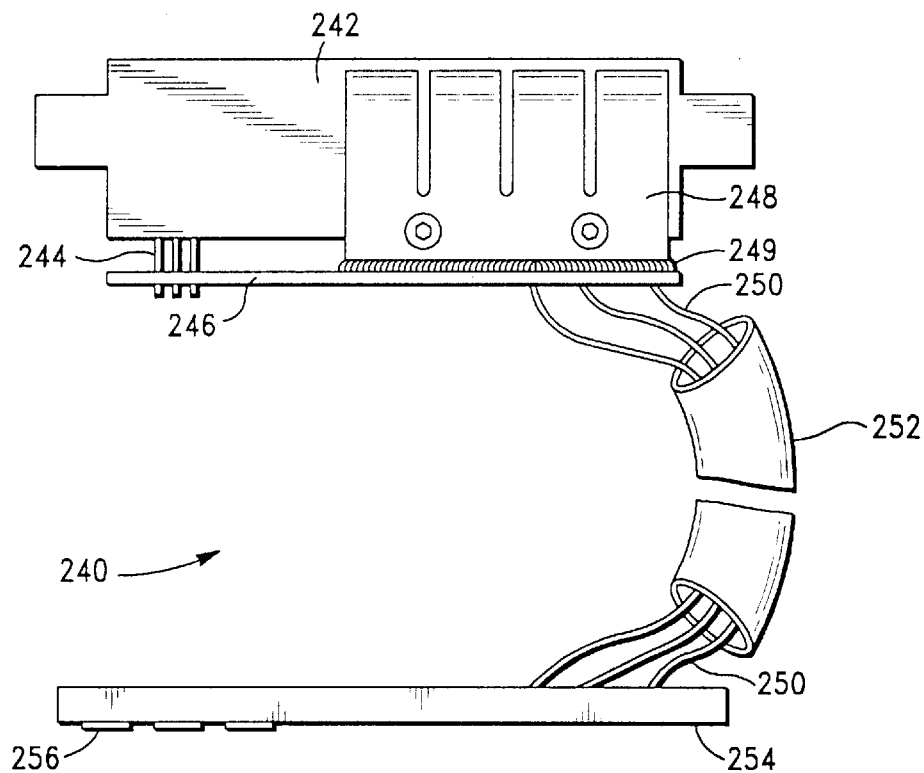
FIG. 12 is a partial pictorial side view illustrating an adapter assembly forming an extension cable.

FIG. 12 is a partial pictorial side view of an adapter assembly in which the receptacle and the plug are connected through an extension cable. The assembly is designated generally by the numeral 240 and includes a rectangular zero-insertion-force receptacle 242, electrical contacts 244, a first printed wiring board 246, a representative micro-coaxial cable 250, a protective covering 252, a second printed wiring board 254, and contact pads 256. FIG. 12 also illustrates grounding fingers 248, and a solder connection 249.

The second printed wiring board 254 and contact pads 256 define an HDMC plug. The details of the electrical connections for the adapter assembly 240 are similar to those described with respect to FIG. 4. The difference here is that, in a preferred embodiment, the micro-coaxial cables 250 (corresponding to 80 in FIG. 4) are up to 12 feet in length. They are enclosed within a protective covering 252, forming an extension cable. In a preferred embodiment, each connector 242 and 254/256 is enclosed in an appropriate protective housing, including cable clamps to relieve strain upon the microco-axial cables 250.

Figures 13, 14:
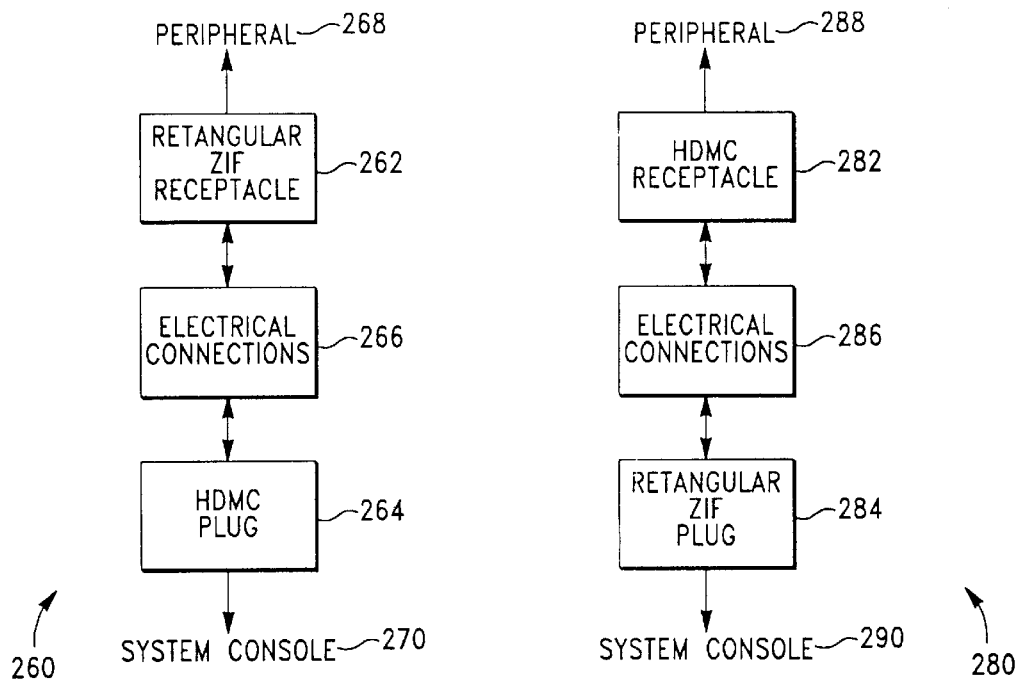
FIG. 13 is a schematic diagram illustrating an adapter assembly according to one aspect of the present invention.
FIG. 14 is a schematic diagram illustrating an adapter assembly according to another aspect of the present invention.

FIGS 13 and 14 are schematic diagrams illustrating two aspects of the present invention. In FIG. 13, an adapter assembly 260 includes a rectangular zero-insertion-force receptacle 262, a high-density micro-coaxial interfacing plug 264, and electrical connections 266 between electrical contacts of the receptacle 262 and corresponding contact pads of the HDMC plug 264. The adapter assembly 260 is used to connect an ultrasound peripheral 268 having a rectangular zero-insertion-force plug to an ultrasound system console 270 equipped with an HDMC receptacle. The electrical connections 266 schematically represent each type of connection contemplated by the present invention, including the extension cable.

In FIG. 14, an adapter assembly 280 includes an HDMC interfacing receptacle 282, a rectangular zero-insertion-force plug 284, and electrical connections 286 between contact pads of the receptacle 282 and corresponding electrical contacts of the plug 284. The adapter assembly 280 is used to connect an ultrasound peripheral 288 having an HDMC interfacing plug to an ultrasound system console 290 equipped with a rectangular zero-insertion-force receptacle. The electrical connections 286 schematically represent each type of connection contemplated by the present invention, including the extension cable.

Figure 15:
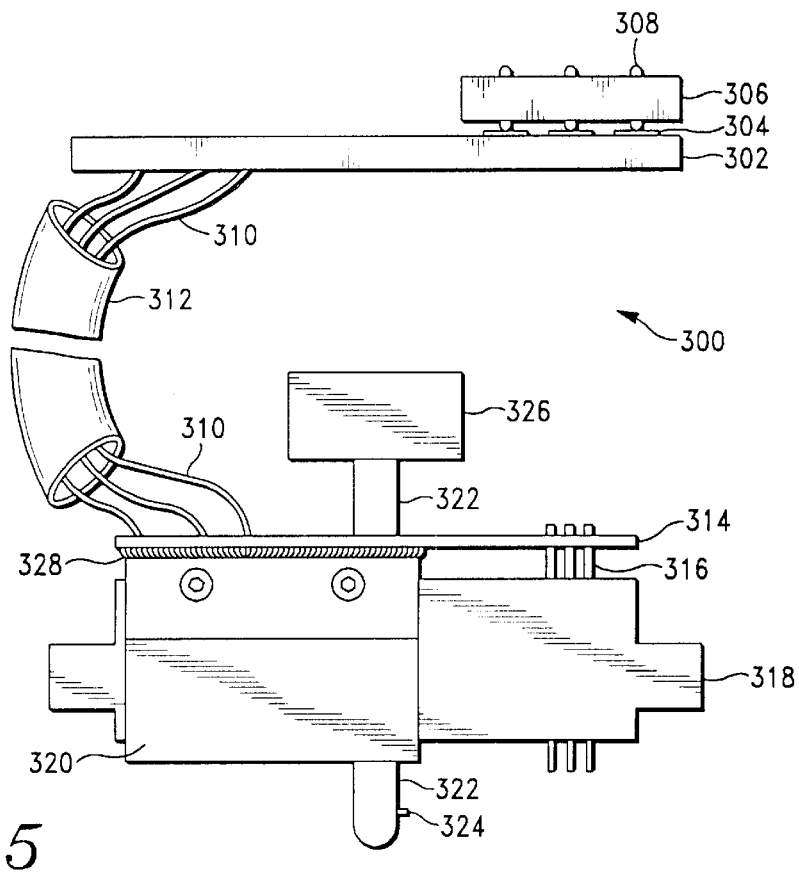
FIG. 15 is a partial pictorial side view illustrating another adapter assembly forming an extension cable.

FIG. 15 is a partial pictorial side view illustrating another adapter assembly, designated generally by the numeral 300. The adapter assembly 300 includes a first printed wiring board 302, contact pads 304, a contact nest 306, contact springs 308, a representative micro-coaxial cable 310, a protective covering 312, a second printed wiring board 314, electrical contacts 316, and a rectangular zero-insertion-force plug 318. FIG. 15 also illustrates a grounding finger 320, a locking mechanism 322, a locking pin 324, a locking mechanism handle 326, and a solder connection 328.

The first printed wiring board 302, contact pads 304, contact nest 306 and contact springs 308 cooperate to define an HDMC interfacing receptacle, as more particularly described in U.S. Pat. No. 5,310,352. The electrical connections between the contact pads 304 and the electrical contacts 316 are completed via the microco-axial cables 310 which can be up to 12 feet in length, in another embodiment.

The locking mechanism 322 includes the locking pin 324 and the handle 326 and is a standard part of the typical rectangular zero-insertion-force plug. The locking mechanism 322 engages a compatibly mating recess on the rectangular receptacle and is used to lock the mating connector halves together and to complete the electrical connection between mating electrical contacts.

In a preferred embodiment, the HDMC receptacle 302-308 and the rectangular zero-insertion-force plug 318 are each enclosed in separate protective housings. The housings include cable clamps to relieve strain on the micro-coaxial cables 310.

Figure 16:
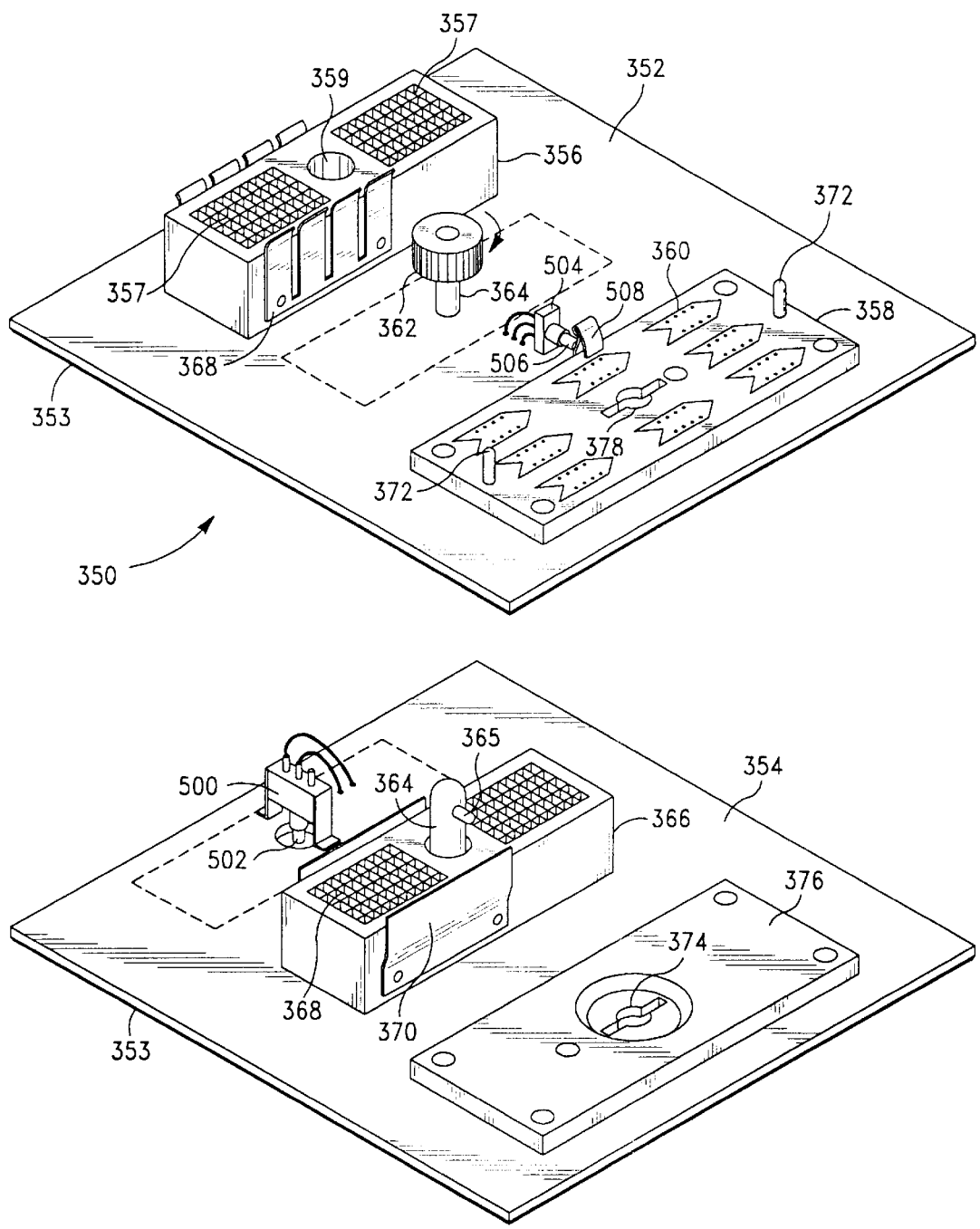
FIG. 16 is a perspective view of both top and bottom sides of an adapter assembly according to another aspect of the present invention.

FIG. 16 is a perspective pictorial view showing both a top and a bottom side of an ultrasound adapter assembly according to another aspect of the present invention. The adapter assembly is designated generally by the numeral 350 and includes a multilayer printed wiring board 353 having a top side 352 and a bottom side 354. The adapter assembly 350 also includes a rectangular zero-insertion-force receptacle 356, a high-density micro-coaxial interfacing receptacle 358, and a rectangular zero-insertion-force plug 366 with locking mechanism 364.

In general, the adapter assembly 350 is used for connecting an ultrasound peripheral having either a rectangular zero-insertion-force plug, or an HDMC interfacing plug, to an ultrasound system console having a rectangular zero-insertion-force receptacle. To use the adapter assembly 350, the plug 366 is inserted into the receptacle of the ultrasound system console and locked in place using the locking mechanism 364, which is operated by the handle 362 located on the top side. Then the ultrasound peripheral is attached to the appropriate receptacle 356 or 358. The multilayer printed wiring board 353 completes the electrical connections between the two rectangular connectors 356, 366, and between the HDMC interfacing receptacle 358 and the rectangular plug 366.

The rectangular receptacle 356 includes electrical contacts 357, a recess 359 for receiving a locking mechanism (see 364), and grounding fingers 368. Only a single set of grounding fingers 368 is shown. In actual practice, two sets of grounding fingers 368 enclose the electrical contacts 357 to form an electrostatic shield and to provide additional ground signal returns. The grounding fingers 368 are connected electrically to a ground plane (not shown) within the multilayer printed wiring board 353.

The rectangular plug 366, located on the bottom side 354 of the adapter assembly 350, includes electrical contacts 368 and grounding fingers 370. Only a single set of grounding fingers 370 is shown. In actual practice, two sets of grounding fingers 370 enclose the electrical contacts 368 to form an electrostatic shield and to provide additional ground signal returns. The grounding fingers 370 are connected electrically to a ground plane (not shown) within the multilayer printed wiring board 353. The grounding fingers 370 are formed to mate compatibly with grounding fingers of the type 368 used also on the ultrasound system console receptacle, and when so mated form an electrostatic shield around the electrical contacts.

The HDMC interfacing receptacle 358 includes contact nests 360, a recess 378 for receiving a locking mechanism of a mating plug (not shown), and guide pins 372 which mate compatibly with guide holes of the mating plug (not shown) for aligning the plug with the receptacle 358. On the bottom side 354 of the adapter assembly 350, a backing plate 376 is positioned opposite the receptacle 358. The backing plate 376 includes a keyway 374 for engaging the locking mechanism of the mating plug (not shown). The backing plate is made of metal and provides both electrostatic shielding and stiffness for the HDMC interfacing receptacle 358. The receptacle 358 is also made of metal and the metal receptacle 358 and the metal backing plate 376 are connected to a ground plane of the multilayer printed wiring board 353. The contact nests 360 are made of an insulating plastic material and are contained within the receptacle 358. Details of the construction and use of an HDMC interfacing receptacle are provided in U.S. Pat. No. 5,310,352.

Figure 19:
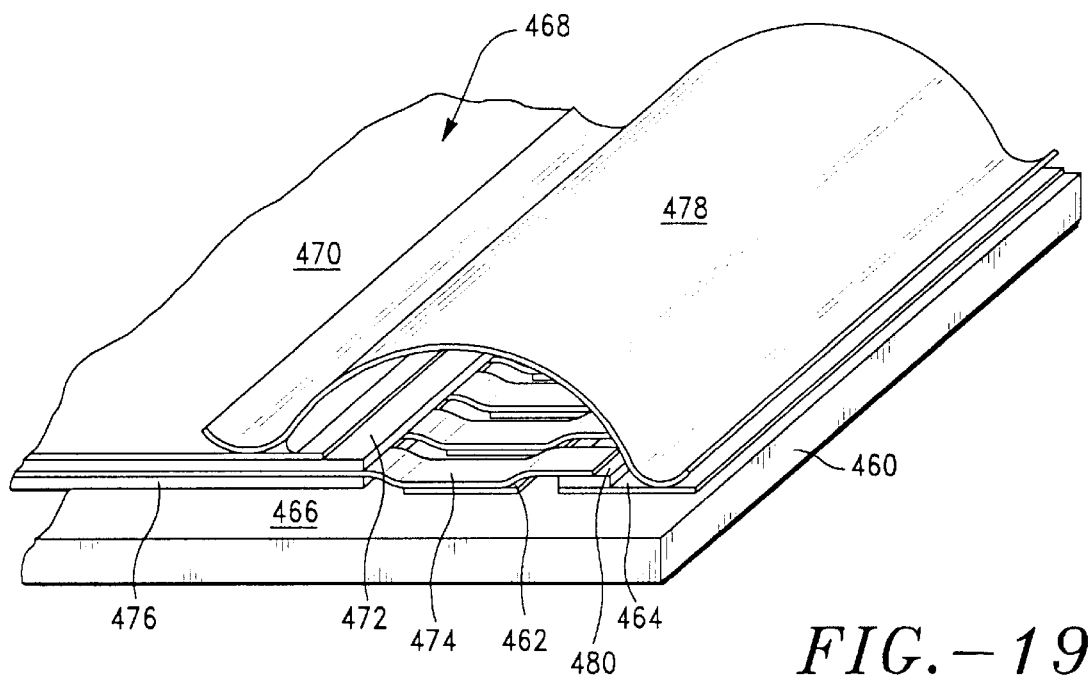
FIG. 19 is a partial perspective view illustrating another method for directly attaching flex-circuit to a printed wiring board.

In a preferred embodiment of the invention and in others where a single plug (e.g. 366) is connected to two or more receptacles (e.g. 356 and 358) an interlock mechanism must be provided to prevent the system from operating when more than one peripheral is connected to the parallel receptacles. Also, the system must be alerted to turn off power to the peripherals before the second peripheral makes electrical contact to avoid connector contact damage. This interlocking function is implemented by two mechanically-operated switches, 500 and 504, as shown in FIG. 19. Normally-open switch 500 is closed by the pressure of the locking shaft (see 364 of FIG. 16) on switch plunger 502 as a zero-insertion-force plug is inserted into receptacle 356. An important feature of this mechanical arrangement is that switch 500 is closed before any electrical contact to the receptacle 356 is completed.

Figure 20:
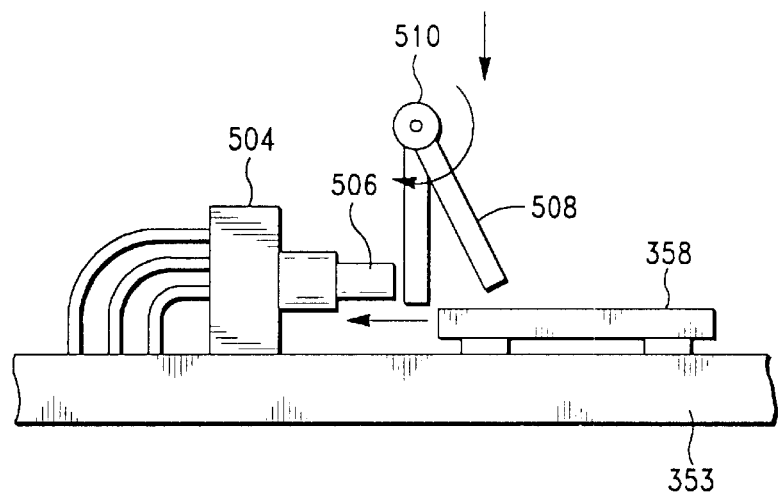
FIG. 20 is a partial end view illustrating one aspect of the adapter assembly shown in FIG. 16.

Similarly, normally-open switch 504 closes as a high-density micro-coaxial plug is inserted into receptacle 358 before any connector contacts are established. FIG. 20 shows details of this mechanical arrangement. A cam 508 rotates about a pivot 510 as a high-density micro-coaxial plug is inserted into high-density micro-coaxial receptacle 358. In turn, cam 508 depresses the plunger 506 of switch 504 closing the switch before contacts are established.

Figure 21:
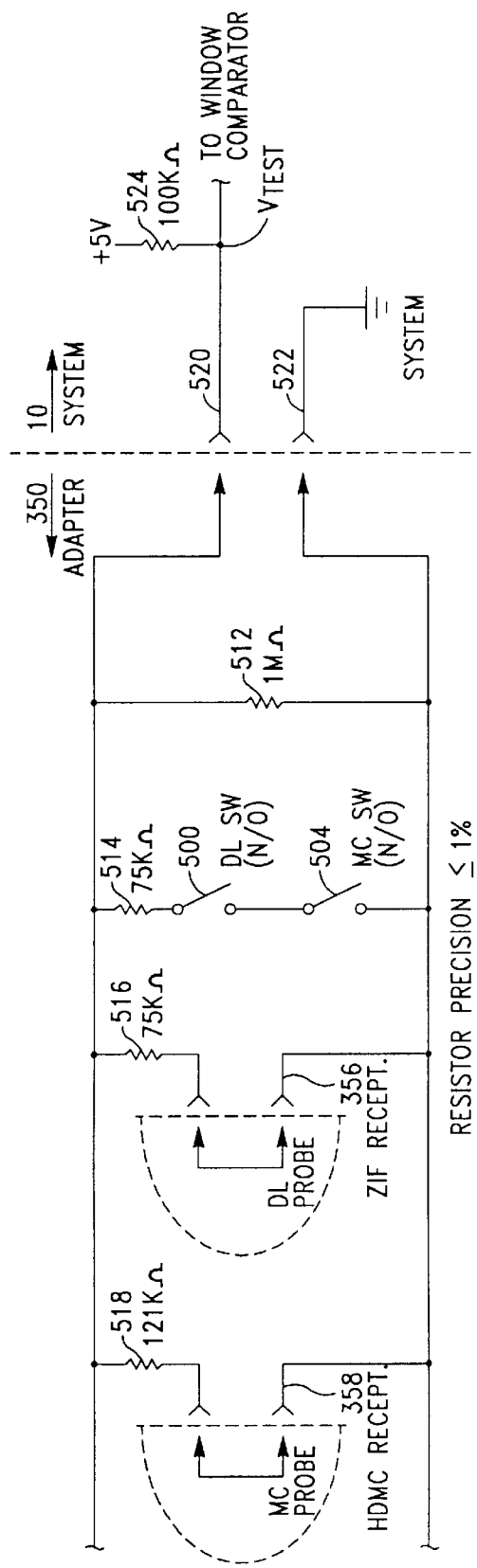
FIG. 21 is a schematic diagram and explanatory table illustrating another aspect of the adapter assembly shown in FIG. 16.

The configuration of adapter and peripheral or peripherals inserted in the system's rectangular zero-insertion-force receptacle is conveyed to the system through several possible electrical combinations of resistors mounted on the adapter printed wiring board 353. FIG. 21 shows a schematic diagram and a state table for this arrangement. The rectangular zero-insertion-force receptacle on the system 10 contains one pin 520 dedicated to conveying connector/adapter state information and at least one pin 522 used for its ground reference. The state pin 520 is connected to a 5-volt power supply via a 100k Ohm resistor 524 and the voltage level at the state pin is sensed by a window comparator (not shown). The window comparator detects which of several DC voltage ranges the state pin-voltage falls into and is a standard circuit that could be designed a number of ways by anyone skilled in the art.

The voltage at the state pin 520 varies according to the resistance presented to it by the adapter card. For example, if no adapter or peripheral is present at receptacle 366 then a very high resistance is presented and the voltage is about 5 volts, if an adapter is plugged in but no peripherals are plugged into the adapter a 1 megohm resistance is presented and the voltage is about 4.6 volts, and so forth. The table in FIG. 21 lists the preferred adapter/peripheral combinations, the corresponding voltage levels presented at the state pin 520 and the state conveyed to the system. This arrangement tells the system 10 which receptacle has a peripheral plugged into it. More importantly, this arrangement gives the system advance warning that a disallowed two-probe condition is pending so it can turn off power to the peripherals and avoid connector contact damage.

FIG. 6 illustrated a specific method for connecting printed wiring boards 106 and 110 via flex-circuit 122 and solder connection. FIGS. 17, 18 and 19 are partial perspective views illustrating three alternative methods for using solder and spot welding to connect flex-circuit to a printed wiring board.

FIG. 17 shows a portion of a printed wiring board 400 having a plurality of individual printed wiring pads 402 and a ground plane 404 disposed on one surface 406. A portion of flex-circuit, indicated generally by the numeral 408, includes a plurality of individual conductors 410 disposed on one surface of a flexible insulating material 412, and has a ground plane 414 disposed on the opposed surface.

The flex-circuit ground plane 414 has been removed from one end 416 of the flex-circuit 408 so that it does not extend much beyond one end 418 of the printed wiring board ground plane 404. The ground plane 414 of the flex-circuit 408 lies flat against the printed wiring board ground plane 404 then rises away from the printed wiring board 400 near the one end 416. Near a line 420 at which the flex-circuit 408 bends away from the printed wiring board 400, a solder fillet 422 is formed between the printed wiring board ground plane 404 and the flex-circuit ground plane 414. The solder fillet 422 extends for the width of the flex-circuit 408.

The absence of the flex-circuit ground plane 414 at the end region 416 makes it easy to bend the flex-circuit conductors 410 in a 180° loop 424 so that the individual conductors 410 align with the individual printed wiring pads 402. A solder fillet 426 is formed at each point of contact between an individual conductor 410 and corresponding solder pad 402.

FIG. 18 illustrates another method for terminating flex-circuit at a printed wiring board. A printed wiring board 430 includes individual wiring termination pads 432 and a grounding strip 434 disposed on one surface 436. A multi-layer flex circuit, identified generally by the numeral 438, includes a ground layer 440, a first insulating layer 442, individual conductive strips 444, and a second insulating layer 446. The method includes a ground strap 448 used to connect the flex-circuit ground plane 440 to the printed wiring board grounding strip 434.

Before assembly, the individual wiring termination pads 432 and the grounding strip 434 are wetted with solder. The flex-circuit ground plane 440 and first insulating layer 442 are removed from an end region 450 of the flex-circuit 438, exposing the individual conductors 444. The exposed conductors 444 and second insulating layer 446 are folded in a 180° loop, permitting the individual flex-circuit conductors 444 to be placed against the wetted wiring termination pads 432. Each point of contact is heated to permit the solder to reflow, forming individual solder fillets 452. Once the conductors 444 have been attached to the wiring termination pads 432, the grounding strap is attached by solder 452 to the flex-circuit ground plane 440 and by solder 456 to the pre solder-wetted printed wiring board grounding strip 434.

FIG. 19 illustrates a method for connecting flex-circuit to a printed wiring board using a combination of spot welding and soldering. A printed wiring board 460 includes individual wiring termination pads 462 and a grounding strip 464 disposed on one surface 466. A flex-circuit, identified generally by the numeral 468, includes a ground plane 470, a first insulating layer 472, a layer of individual conductors 474, and a second insulating layer 476. The final assembly includes a grounding strap 478.

During assembly, a portion of the flex-circuit ground plane 470, the first insulating layer 472, and the second insulating layer 476 are removed from one end of the flex circuit to expose the individual flex-circuit conductors 474.

The flex-circuit 468 is then laid onto the printed wiring board surface 466 with the second insulating layer 476 adjacent the printed wiring board surface 466. Next, the individual flex-circuit conductors 474 are attached to the individual wiring termination pads 462. In one specific example of the method, the conductors 474 are spot welded to the termination pads 462. In another specific example of the method, the termination pads 462 are pre-wetted with solder and the conductors 474 are forced against the termination pads 462 using a hot bar, causing the solder to reflow, attaching the conductors to the pads.

In a specific embodiment, a portion 480 of the second insulating layer 476 is not removed from the ends of the individual flex-circuit conductors 474. This insulating strip 480 serves to insulate the individual conductors 474 from the printed wiring board grounding strip 464. In another specific embodiment, the second insulating layer 476 is completely removed from the exposed region of the flex-circuit conductors, and a separate insulating strip 480 is bonded to the grounding strip 464.

While the invention has been described in relation to the embodiments shown in the accompanying Drawing figures, other embodiments, alternatives and modifications will be apparent to those skilled in the art. It is intended that the Specification be only exemplary, and that the true scope and spirit of the invention be indicated by the following claims.

What is claimed is:

1. An adapter assembly for connecting a first electrical device having a rectangular zero-insertion-force plug to a second electrical device having a high-density micro-coaxial interfacing receptacle, the adapter assembly comprising:

a printed wiring board including electrical contact pads, defining a high-density micro-coaxial interfacing plug for compatibly mating with the high-density micro-coaxial interfacing receptacle;

a rectangular zero-insertion-force receptacle including electrical contacts for compatibly mating with the rectangular zero-insertion-force plug; and electrical connections between predetermined ones of the contact pads and the electrical contacts, and defining a connection relationship between the contact pads and the electrical contacts.

2. The adapter assembly as set forth in claim 1, further including the electrical connections being adapted for connecting an ultrasound peripheral to an ultrasound system console.

3. The adapter assembly as set forth in claim 1, wherein the first electrical device is an ultrasound peripheral.

4. The adapter assembly as set forth in claim 3, wherein the second electrical device is an ultrasound system console.

5. The adapter assembly as set forth in claim 1, further including means for supporting the printed wiring board and the rectangular zero-insertion-force receptacle.

6. The adapter assembly as set forth in claim 5, further including a mechanical latch attached to the supporting means and adapted for locking the printed wiring board to the second electrical device high-density micro-coaxial interfacing receptacle.

7. The adapter assembly as set forth in claim 6, further including a housing for containing the printed wiring board, the rectangular zero-insertion-force receptacle, the supporting means, the mechanical latch and the electrical connections.

8. The adapter assembly as set forth in claim 1, wherein the printed wiring board defines a first printed wiring board, and further including a second printed wiring board mechanically and electrically attached to a wiring end of the electrical contacts of the rectangular zero-insertion-force receptacle, and forming a portion of the electrical connections between the contact pads and the electrical contacts.

9. The adapter assembly as set forth in claim 8, wherein the second printed wiring board includes feedthroughs which are soldered to the wiring end of corresponding ones of the electrical contacts and also includes solder pads which are connected to predetermined ones of the feedthroughs by printed wiring.

10. The adapter assembly as set forth in claim 9, wherein the electrical connections between the contact pads and the electrical contacts are completed via a surface mount pin and contact connector system.

11. The adapter assembly as set forth in claim 9, wherein the electrical connections between the contact pads and the electrical contacts are completed via a plurality of micro-coaxial conductors having opposed ends connected to a portion of the second printed wiring board and the first printed wiring board.

12. The adapter assembly as set forth in claim 11, wherein the micro-coaxial conductors are connected to the printed wiring boards by solder connection.

13. The adapter assembly as set forth in claim 11, wherein at least one printed wiring board includes micro-coaxial conductor terminations for connecting the micro-coaxial conductors to said printed wiring board.

14. The adapter assembly as set forth in claim 9, wherein the electrical connections between the contact pads and the electrical contacts are completed via flex-circuit having opposed ends connected to a portion of the second printed wiring board and the first printed wiring board.

15. The adapter assembly as set forth in claim 14, wherein the flex-circuit is connected to the printed wiring boards by solder connection.

16. The adapter assembly as set forth in claim 1, further including a rigid-flex assembly adapted for a mechanical and electrical connection to a wiring end of the electrical contacts of the receptacle and forming a portion of the electrical connections between the contact pads and the electrical contacts.

17. The adapter assembly as set forth in claim 16, wherein the rigid-flex assembly includes a first portion having feedthroughs which are soldered to the wiring end of corresponding electrical contacts and includes a second portion having solder pads which are connected to predetermined feedthroughs by printed and flex wiring.

18. The adapter assembly as set forth in claim 17, wherein the electrical connections between the contact pads and the electrical contacts are completed via a plurality of micro-coaxial cables having opposed ends connected to the second portion of the rigid-flex assembly and the printed wiring board.

19. The adapter assembly as set forth in claim 18, wherein the micro-coaxial cable is connected to the rigid-flex assembly and the printed wiring board at the opposed ends by solder connection.

20. The adapter assembly as set forth in claim 18, wherein at least one of the rigid-flex assembly and the printed wiring board includes micro-coaxial cable terminations for completing the micro-coaxial cable connection.

21. The adapter assembly as set forth in claim 1, wherein the electrical connections between the contact pads and the electrical contacts are completed through a plurality of micro-coaxial cables, the micro-coaxial cables defining an electrical extension and permitting the contact pads and the electrical contacts to be spaced apart.

22. The adapter assembly as set forth in claim 21, further including the electrical connections being adapted for connecting an ultrasound peripheral to an ultrasound system console.

23. An adapter system for connecting an ultrasound peripheral having a cable terminated in an ITT Cannon® DL-ZIF plug to an ultrasound system console connector comprising:

an ITT Cannon® DL-ZIF receptacle for mating with the compatible ITT Cannon® DL-ZIF plug, the receptacle including a plurality of electrical contacts;

a system printed wiring board including a plurality of high density electrical contact pads for mating with the ultrasound system console connector;

means for supporting the receptacle and the system printed wiring board in a fixed relation, and including means for attaching the system printed wiring board to the ultrasound system console connector; electrical connections between predetermined ones of the system contact pads and predetermined ones of the receptacle electrical contacts, and defining a connection relationship between the contact pads and the electrical contacts; and a housing for enclosing the receptacle, the system printed wiring board, the supporting means and the electrical connections.

24. The adapter system as set forth in claim 23, wherein the electrical connections are provided by a combination of a second printed wiring board and microco-axial conductors.

25. The adapter system as set forth in claim 23, wherein the electrical connections are provided by a combination of rigid-flex and micro-coaxial conductors.

26. The adapter system as set forth in claim 23, wherein the electrical connections are provided by a combination of a second printed wiring board and flex-circuit.

* * * * *